(12) United States Patent
Pagenkopf

(10) Patent No.: US 10,283,262 B2
(45) Date of Patent: May 7, 2019

(54) ENHANCED COMMON MODE CURRENT REDUCTION IN THREE-PHASE INDUCTORS, TRANSFORMERS, AND MOTOR DRIVE SYSTEMS

(71) Applicant: Hubbell Incorporated, Shelton, CT (US)

(72) Inventor: Kenneth Edward Pagenkopf, Shorewood, WI (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 15/787,254

(22) Filed: Oct. 18, 2017

(65) Prior Publication Data

US 2018/0108472 A1   Apr. 19, 2018

Related U.S. Application Data

(60) Provisional application No. 62/409,674, filed on Oct. 18, 2016.

(51) Int. Cl.
*H02P 3/18*   (2006.01)
*H01F 27/42*   (2006.01)
(Continued)

(52) U.S. Cl.
CPC .......... *H01F 27/42* (2013.01); *H01F 17/062* (2013.01); *H01F 27/24* (2013.01); *H01F 27/255* (2013.01);
(Continued)

(58) Field of Classification Search
CPC .............................. H01F 17/062; H02M 1/126
See application file for complete search history.

(56) References Cited

U.S. PATENT DOCUMENTS

| 6,028,405 A | 2/2000 | Kume et al. |
| 6,208,098 B1 | 3/2001 | Kume et al. |
(Continued)

OTHER PUBLICATIONS

PCT/US2017/057183 International Search Report and Written Opinion dated Jan. 18, 2018 (12 pages).
(Continued)

*Primary Examiner* — Karen Masih
(74) *Attorney, Agent, or Firm* — Michael Best & Friedrich, LLP

(57) ABSTRACT

Enhanced common mode current reduction in three-phase inductors, transformers, and motor drive systems. A motor drive system includes an iron core transformer, a common-mode transformer coupled to a three-phase motor, and a variable speed drive providing a three-phase power signal to drive the three-phase motor, and coupled to the iron core transformer and the common mode transformer. The system includes a DC bus having a DC bus midpoint. The common-mode transformer includes a toroidal ferrite core, a first choke winding, a second choke winding, a third choke winding, a first coupling winding collocated with the first choke winding, a second coupling winding collocated with the second choke winding, and a third coupling winding collocated with the third choke winding. The first, second, and third coupling windings are coupled in parallel to one another. The coupled windings couple a neutral point of the iron core transformer to the DC bus midpoint.

19 Claims, 5 Drawing Sheets

(51) Int. Cl.
  *H01F 17/06* (2006.01)
  *H01F 27/24* (2006.01)
  *H01F 27/255* (2006.01)
  *H01F 27/28* (2006.01)
  *H02M 1/12* (2006.01)
  *H02P 27/16* (2006.01)
  *H03H 7/01* (2006.01)
  *H01F 17/00* (2006.01)

(52) U.S. Cl.
  CPC ............ *H01F 27/28* (2013.01); *H02M 1/126* (2013.01); *H02P 27/16* (2013.01); *H03H 7/0115* (2013.01); *H01F 2017/0093* (2013.01); *H02M 2001/123* (2013.01)

(56) References Cited

U.S. PATENT DOCUMENTS

| | | |
|---|---|---|
| 2003/0205990 A1* | 11/2003 | Wittenbreder, Jr. .... H02M 1/34 323/222 |
| 2006/0285367 A1 | 12/2006 | Yasumura |
| 2007/0001795 A1 | 1/2007 | Brandt et al. |
| 2008/0080106 A1 | 4/2008 | Mirafzal et al. |
| 2014/0139202 A1 | 5/2014 | White |
| 2015/0102882 A1 | 4/2015 | Shudarek |
| 2016/0093431 A1 | 3/2016 | Quilici |

OTHER PUBLICATIONS

Mahesh Mysore Swamy, "Common Mode Current Attenuation Techniques for Use with PWM Drives", IEEE Transactions on Power Electronics, vol. 16, No. 2, Mar. 2001 (8 pages).

\* cited by examiner

| POWER WINDING | SHORTED WINDING | LNOM(µH) | LLKG(µH) ||
|---|---|---|---|---|
| | | | 4th ONLY | 4-5-6 |
| RED | NONE | 1024 | | |
| GREEN | NONE | 1028 | | |
| BLUE | NONE | 1031 | | |
| RED | GREEN | | 127 | 13.4 |
| RED | BLUE | | 127 | 16.1 |
| GREEN | BLUE | | 118 | 17.2 |

↑ 400 SYSTEM   ↑ 500 ENHANCED SYSTEM

| PROTO | COUPLING DRIVE TO POWER ||
|---|---|---|
| | 4th ONLY | 4-5-6 |
| FERRITE | 98.4% | 100.0% |
| 3PH-SS | 99.3% | 100.0% |
| 2PH-SS | 96.6% | 100.1% |

ENHANCED COMMON MODE CURRENT REDUCTION IN THREE-PHASE INDUCTORS, TRANSFORMERS, AND MOTOR DRIVE SYSTEMS

RELATED APPLICATION

The present application claims the benefit of U.S. Provisional Patent Application No. 62/409,674, filed Oct. 18, 2016, the entire contents of which is hereby incorporated by reference.

FIELD

The present application relates generally to electrical components, such as inductors, and, more particularly, to common mode inductors.

BACKGROUND

Common mode (CM) inductors are used to reduce common mode electromagnetic interference (EMI) noise by imposing impedance that exists primarily in the common mode (i.e., each line to ground). Such inductors saturate magnetically (i.e., a high flux density exists in the core) from current imbalances. Current imbalances can come from external noise and imbalance, but also from the inductors' own leakage inductance, which occurs between windings.

Common mode transformers can be used in three-phase motor drive systems to inject a signal into power windings to help cancel out CM noise. To be effective, coupling between the drive winding and the power windings must be as complete as possible to allow for complete magnetic cancellation. In some systems, a fourth drive winding is wound in the same sense as the total power winding combination.

BRIEF DESCRIPTION OF THE DRAWINGS

FIG. 6 is a table illustrating the leakage inductance reduction from an enhanced common mode transformer.

FIG. 7 is a table illustrating the coupling performance of the enhanced motor drive system of FIG. 5.

DETAILED DESCRIPTION

Figure 1:
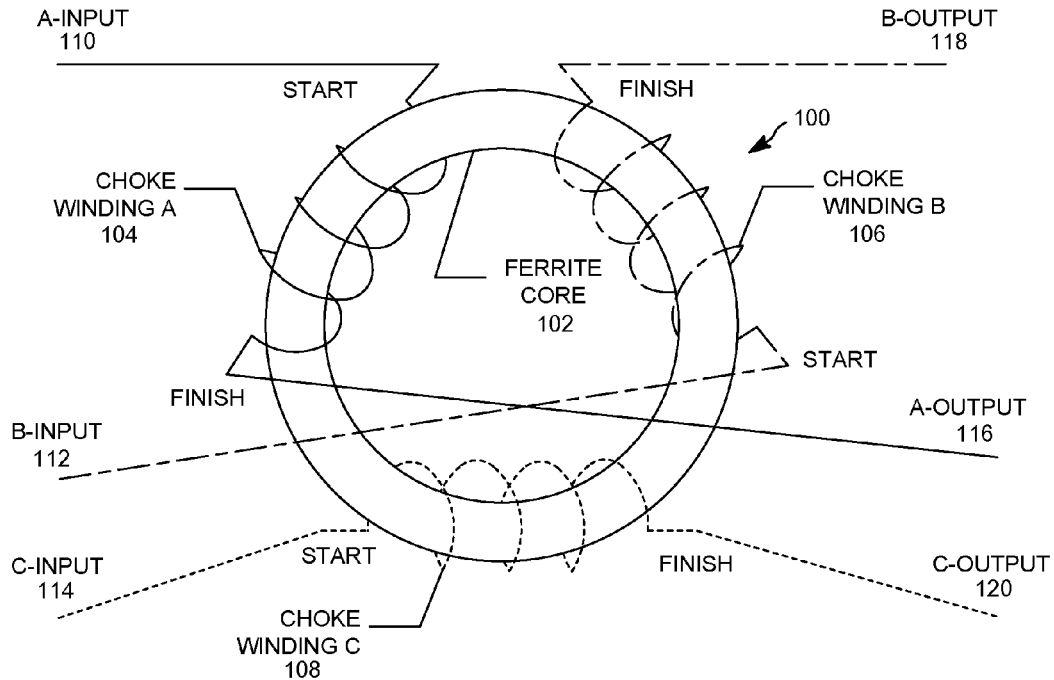
FIG. 1 is a diagram of a three-phase common mode inductor.

Embodiments presented herein provide enhanced common mode current reduction in three-phase inductors, transformers, and motor drive systems.

One example embodiment provides a common mode inductor. The inductor includes a ferrite core, a first winding pair wound on a first portion of the ferrite core, a second winding pair wound on a second portion of the ferrite core, and a third winding pair wound on a third portion of the ferrite core. In some embodiments, the first winding pair includes a first choke winding and a first coupling winding that is electrically isolated from the first choke winding and wound in the same sense as the first choke winding. In such embodiments, the second winding pair includes a second choke winding and a second coupling winding that is electrically isolated from the second choke winding and wound in the same sense as the second choke winding. In such embodiments, the third winding pair includes a third choke winding and a third coupling winding that is electrically isolated from the third choke winding and wound in the same sense as the third choke winding. In some embodiments, the first choke winding and the first coupling winding are both wound around a first portion of the ferrite core. In such embodiments, the second choke winding and the second coupling winding are both wound around a second portion of the ferrite core. In such embodiments, the third choke winding and the third coupling winding are both wound around a third portion of the ferrite core. In such embodiments, the first portion, the second portion, and the third portion are distinct from one another.

Another example embodiment provides a drive system for a three-phase motor. The system includes an iron core transformer. The system includes a common-mode transformer coupled to the three-phase motor. The system includes a variable speed drive coupled to the iron core transformer and the common mode transformer, the variable speed drive providing a three-phase power signal to drive the three-phase motor. The system includes a DC bus having a DC bus midpoint. The common-mode transformer includes a toroidal ferrite core, a first choke winding, a second choke winding, a third choke winding, a first coupling winding collocated with the first choke winding, a second coupling winding collocated with the second choke winding, and a third coupling winding collocated with the third choke winding. The first, second, and third coupling windings are coupled in parallel to one another. The coupled windings couple a neutral point of the iron core transformer to the DC bus midpoint.

Another example embodiment provides a common mode transformer. The transformer includes a toroidal ferrite core, a first choke winding, a second choke winding, a third choke winding, a first coupling winding collocated with the first choke winding, a second coupling winding collocated with the second choke winding, and a third coupling winding collocated with the third choke winding. The first, second, and third coupling windings are coupled in parallel to one another.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

For ease of description, some or all of the exemplary systems presented herein are illustrated with a single exemplar of each of its component parts. Some examples may not describe or illustrate all components of the systems. Other exemplary embodiments may include more or fewer of each of the illustrated components, may combine some components, or may include additional or alternative components.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting, and coupling. Further, "connected" and "coupled" are not restricted to physical or mechanical connections or couplings, and can include electrical connections or couplings, whether direct or indirect. Also, electronic communications and notifications may be performed using any known means including wired connections, wireless connections, etc.

It should also be noted that a plurality of hardware and software based devices, as well as a plurality of different structural components may be used to implement the invention. In addition, it should be understood that embodiments of the invention may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects of the invention may be implemented in software (e.g., stored on non-transitory computer-readable medium) executable by one or more processors. As such, it should be noted that a plurality of hardware and software based devices, as well as a plurality of different structural components may be utilized to implement the invention. For example, "control units" and "controllers" described in the specification can include one or more processors, one or more memory modules including non-transitory computer-readable medium, one or more input/output interfaces, and various connections (e.g., a system bus) connecting the components.

FIG. 1 is a diagram of a three-phase common mode inductor 100. The common mode inductor 100 includes a ferrite core 102, a choke winding A 104, a choke winding B 106, and a choke winding C 108. As an example, a toroidal ferrite core 102 is illustrated. Other embodiments may use ferrite, steel, or powder cores having toroidal or other geometries. The choke windings 104, 106, 108 are insulated conductors (i.e., wires). The gauge of the choke windings 104, 106, 108 is uniform among the windings, and is chosen based on operating current and voltage rating for the inductor. Choke winding A 104, choke winding B 106, and choke winding C 108 each have the same number of turns around the ferrite core 102, and each of the choke windings 104, 106, 108 turns in the same sense (i.e., direction) as the others (e.g., all turn clockwise about the ferrite core 102).

The three-phase common mode inductor 100 may be used to couple a power source and a load. For example, a three-phase power source (not shown) is coupled to the A-INPUT 110, the B-INPUT 112, and the C-INPUT 114, and a three-phase load (not shown) is coupled to the A-OUTPUT 116, the B-OUTPUT 118, and the C-OUTPUT 120. Magnetic flux, caused by the current flow through the choke windings 104, 106, 108, flows inside the ferrite core 102. Each of the choke windings 104, 106, 108 works as an inductor in one of the power phases, generating an impedance against common mode current. Due to magnetic flux cancellation in the core, a similar impedance is not generated for differential mode currents. Thus, the three-phase common mode inductor 100 suppresses noise (i.e., common mode currents), while passing desirable signals (i.e., differential mode currents).

However, imperfect magnetic coupling between the choke windings 104, 106, 108 produces a leakage inductance which leads to incomplete cancellation of magnetic flux in the ferrite core. Leakage inductance limits the common mode inductance of the inductor 100, because it contributes to the magnetic saturation of the ferrite core ($B_{max}$), as expressed in the following equation:

$$B_{max} = \frac{2\pi LI * 10^8}{4.44NAe}$$

where L is the leakage inductance, I is the current, N is the number of turns of the inductor 100, and Ae is the cross-sectional area of the ferrite core 102. When the ferrite core 102 is magnetically saturated, the inductor 100 will no longer function correctly, and may become damaged.

Common mode inductance for an inductor, and thus common mode noise suppression, is increased when leakage inductance for the inductor is reduced. Accordingly, embodiments presented herein reduce leakage inductance between common mode windings 104, 106, 108, and allow for higher inductances to be realized without magnetic saturation, thereby improving common mode EMI noise reduction.

Figure 2:
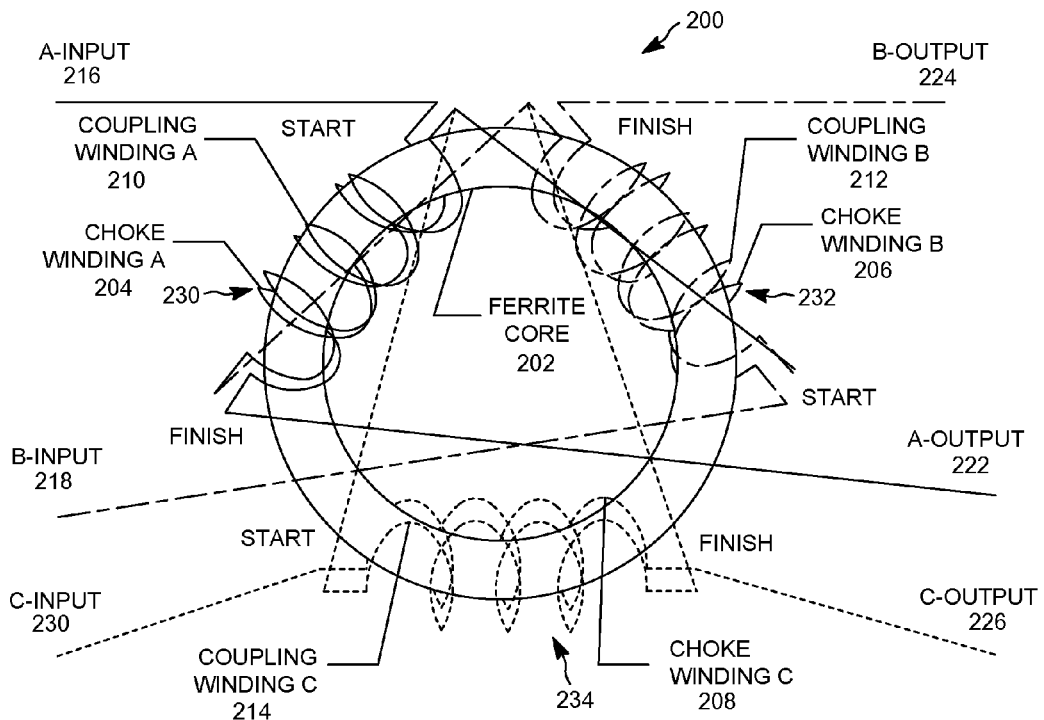
FIG. 2 is a diagram of an enhanced three-phase common mode inductor, according to some embodiments.

FIG. 2 schematically illustrates one example embodiment of an enhanced three-phase common mode inductor 200. The common mode inductor includes a ferrite core 202, a choke winding A 204, a choke winding B 206, a choke winding C 208, a coupling winding A 210, a coupling winding B 212, and a coupling winding C 214. As an example, a toroidal ferrite core 202 is illustrated. Other embodiments may use ferrite, steel, or powder cores having toroidal or other geometries. The choke windings 204, 206, 208 are similar in construction and makeup to those described above with respect to FIG. 1.

The coupling winding A 210, the coupling winding B 212, and the coupling winding C 214 are insulated conductors (i.e., wires). In some embodiments, the gauge of the coupling windings 210, 212, 214 is uniform among the windings. In some embodiments, one or more of the choke windings 204, 206, 208, and the coupling windings 210, 212, 214 and wound from insulated conductors that include multiple strands of wire (i.e., stranded wire conductors). In some embodiments, the gauge of the coupling windings 210, 212, 214 may be lower than the gauge of the choke windings 204, 206, 208, as the coupling windings 210, 212, 214 are not used for power transmission to the load. The coupling windings 210, 212, 214 are electrically connected in parallel, as illustrated in FIG. 2. The coupling windings 210, 212, 214 are electrically isolated from the choke windings 204, 206, 208.

The coupling windings 210, 212, 214 are co-located with the choke windings 204, 206, 208 on the ferrite core 202. The coupling winding A 210 corresponds to the choke winding A 204, forming a winding pair A 230. The coupling winding B 212 corresponds to the choke winding B 206, forming a winding pair B 232. The coupling winding C 214 corresponds to the choke winding C 208, forming a winding pair C 234. Each of the two windings (i.e., a coupling winding and its corresponding choke winding) in each one of the winding pairs 230, 232, 234 is wound around the same portion of the ferrite core 202, and each of the winding pairs 230, 232, 234 is wound around its own distinct portion of the ferrite core 202. The choke winding and the coupling winding in a winding pair have an identical number of turns, and each is wound around the ferrite core 202 in the same sense. For example, if each choke winding has ten clockwise turns, then each coupling winding will have ten clockwise turns.

Like the three-phase common mode inductor 100, the enhanced three-phase common mode inductor 200 may be used to couple a power source and a load. For example, a three-phase power source (not shown) is coupled to the A-INPUT 216, the B-INPUT 218, and the C-INPUT 220, and a three-phase load (not shown) is coupled to the A-OUTPUT 222, the B-OUTPUT 224, and the C-OUTPUT 226.

Figure 3:
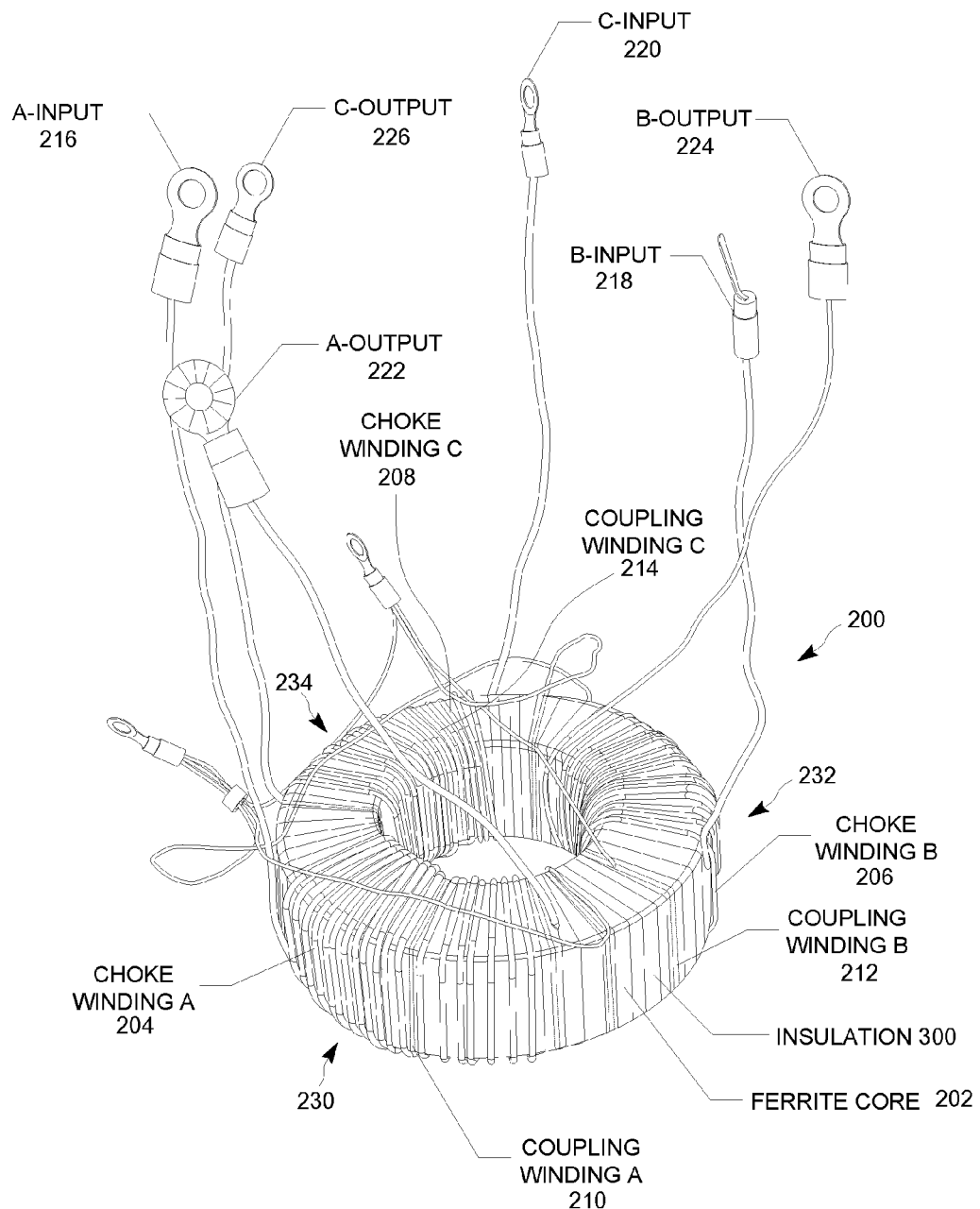
FIG. 3 is an illustration of an enhanced three-phase common mode inductor, according to some embodiments.

FIG. 3 is an illustration of one example embodiment of the enhanced three-phase common mode inductor 202. As noted above, each of the two windings in the winding pairs 230, 232, 234 is wound around the same portion of the ferrite core 202. For example, as illustrated in FIG. 3, each of the coupling windings 210, 212, 214 is wound around the ferrite core 202 beneath its corresponding choke winding. In some embodiments, for each of the winding pairs 230, 232, 234, the coupling winding conductor is located directly beneath, with respect to the ferrite core, the choke winding conductor throughout the winding. The choke windings and their coupling windings are separated by an insulation barrier 300 (e.g., kapton wrap).

The coupling windings 210, 212, 214 of the enhanced three-phase common mode inductor 200 improve the magnetic coupling between the choke windings 204, 206, 208 compared to the three-phase common mode inductor 100. Improved magnetic coupling reduces leakage inductance, which, in turn, reduces un-cancelled magnetic flux. For example, the leakage inductance of the choke winding A on the three-phase inductor pictured in FIG. 3 was measured at 134 µH with the coupling windings disconnected from one another. With the coupling windings electrically connected in parallel, as illustrated in FIG. 3, the leakage inductance of the choke winding A 204 was reduced by roughly a factor of five, to 24 µH. Because inductance is proportional to the number of turns squared ($N^2$), $$\left(L \sim \frac{\mu_e N^2 A e}{l_e}\right)$$

a reduction in leakage inductance by a factor of five can lead to an increase in common mode inductance by a factor of twenty-five with the same flux density from leakage inductance.

Figure 4:
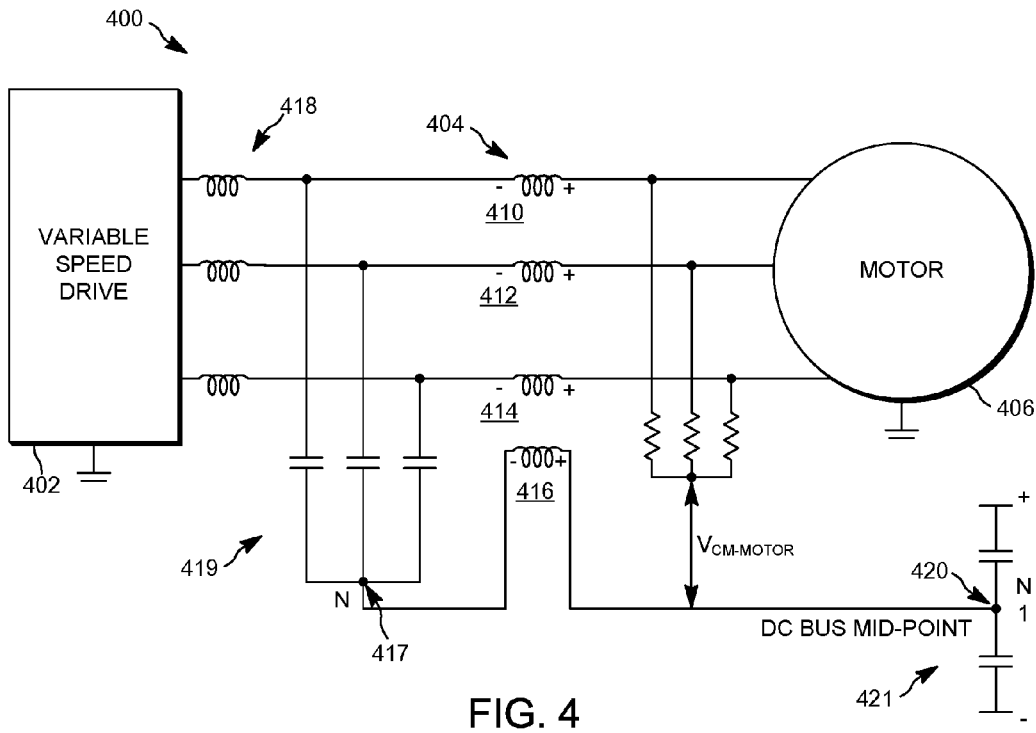
FIG. 4 is a schematic diagram of a three-phase motor drive system.

FIG. 4 is a schematic diagram of a three-phase motor drive system 400, as described in U.S. Pat. Nos. 6,028,405 and 6,208,098 B1. The three-phase motor drive system 400 includes a variable frequency drive 402, a common mode transformer 404, and a three-phase motor 406. The variable frequency drive 402, the common mode transformer 404, and the three-phase motor 406 are electrically coupled as illustrated in FIG. 4. The variable frequency drive 402 provides a three-phase power signal to drive the three-phase motor 406 through a set of filter inductors 418.

The common-mode transformer 404 includes a first choke winding 410, a second choke winding 412, a third choke winding 414, and a fourth winding 416, all wound about a toroidal ferrite core (not shown). The fourth winding 416 is wound in the same sense as the other windings, and is coupled to the neutral point 417 of a capacitor neutral star connection 419 and the DC bus midpoint 420. A current is forced in the fourth winding 416, which current is dependent on the voltage of the neutral point 417 relative to the DC bus 421, and flows in an opposite direction to cancel the common mode current and, hence, the common mode voltage. However, the fourth winding 416 cannot be collocated with all of the drive windings on a toroidal structure, as the coupling is reduced, and complete magnetic field cancellation does not occur.

As noted above, leakage inductances lead to un-cancelled magnetic fields. The leakage inductances produce voltage drops, which are not accounted for in the voltage between the neutral point 417 and the DC bus midpoint 420. Therefore, a portion of the common mode currents are not cancelled in the three-phase motor drive system 400. Accordingly, embodiments presented herein provide an enhanced three-phase motor drive system 500, which reduces leakage inductance and more effectively cancels common mode currents.

Figure 5:
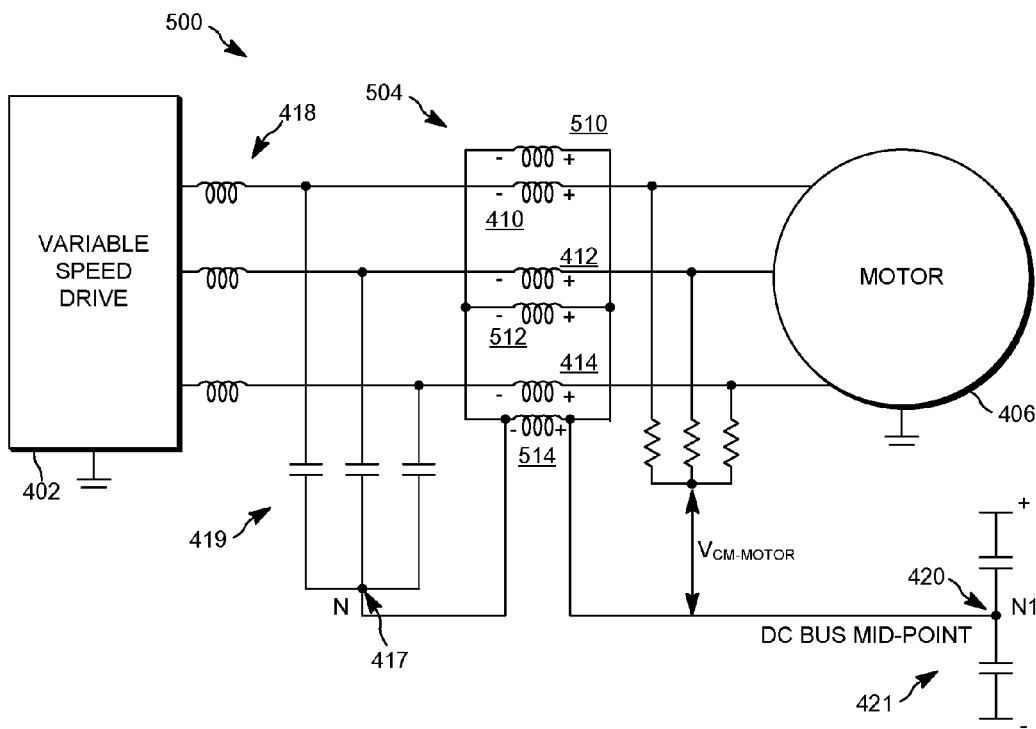
FIG. 5 is a schematic diagram of an enhanced three-phase motor drive system, according to some embodiments, including an enhanced common mode transformer.

FIG. 5 is a schematic diagram of one embodiment of an enhanced three-phase motor drive system 500. The embodiment illustrated in FIG. 5 includes similar components as the three-phase motor drive system 400 of FIG. 4. The enhanced three-phase motor drive system 500 differs from the three-phase motor system 400 in that it includes an enhanced common-mode transformer 504. The enhanced common-mode transformer 504 includes a first choke winding 410, a second choke winding 412, a third choke winding 414, a fourth winding 510, a fifth winding 512, and a sixth winding 514, all wound about a toroidal ferrite core (not shown). The fourth winding 510, the fifth winding 512, and the sixth winding 514 are coupling windings, for example, as described above with respect to FIG. 2 and FIG. 3. The fourth winding 510 is collocated with the first choke winding 410. The fifth winding 512 is collocated with the second choke winding 412. The sixth winding 514 is collocated with the third choke winding 414. The coupling windings 510, 512, 514 are wound in the same sense as the choke windings 410, 412, 414. The coupling windings 510, 512, 514 are separated from the choke windings 410, 412, 414 by an insulation barrier (not shown), for example, as illustrated in FIG. 3.

As illustrated in FIG. 5, the fourth winding 510, the fifth winding 512, and the sixth winding 514 are electrically connected to one another in parallel. The parallel-connected windings couple the neutral point 417 of the capacitor neutral star connection 419 to the DC bus midpoint 420. When the enhanced three-phase motor drive system 500 is operating to drive a motor, a current is forced in the fourth winding 510, the fifth winding 512, and the sixth winding 514, which current is dependent on the voltage of the neutral point 417 relative to the DC bus 421. The current flows in an opposite direction to the common mode current. This cancels the common mode current, therefore cancelling or greatly reducing the common mode voltage.

The common mode voltage reduction operates similarly to the fourth winding 416 of the system 400 of FIG. 4. However, the presence of the three coupling windings 510, 512, 514 in the enhanced three-phase motor drive system 500 significantly reduces the leakage inductances over the system 400. For example, as illustrated in the chart 600 of FIG. 6, the leakage inductance ranges from 118 µH to 127 µH for the system 400, but ranges from only 13.4 µH to 17.2 µH for the enhanced system 500. The addition of the fifth winding 512 and the sixth winding 514 provides leakage inductances as low as co-locating power windings on the same inductor core, but with significantly easier insulation schemes. The reduction in leakage inductance leads to an improvement in common mode cancellation, reducing the common mode voltage measured at the motor ($V_{CM\text{-}motor}$) to near-zero levels.

Figure 8:
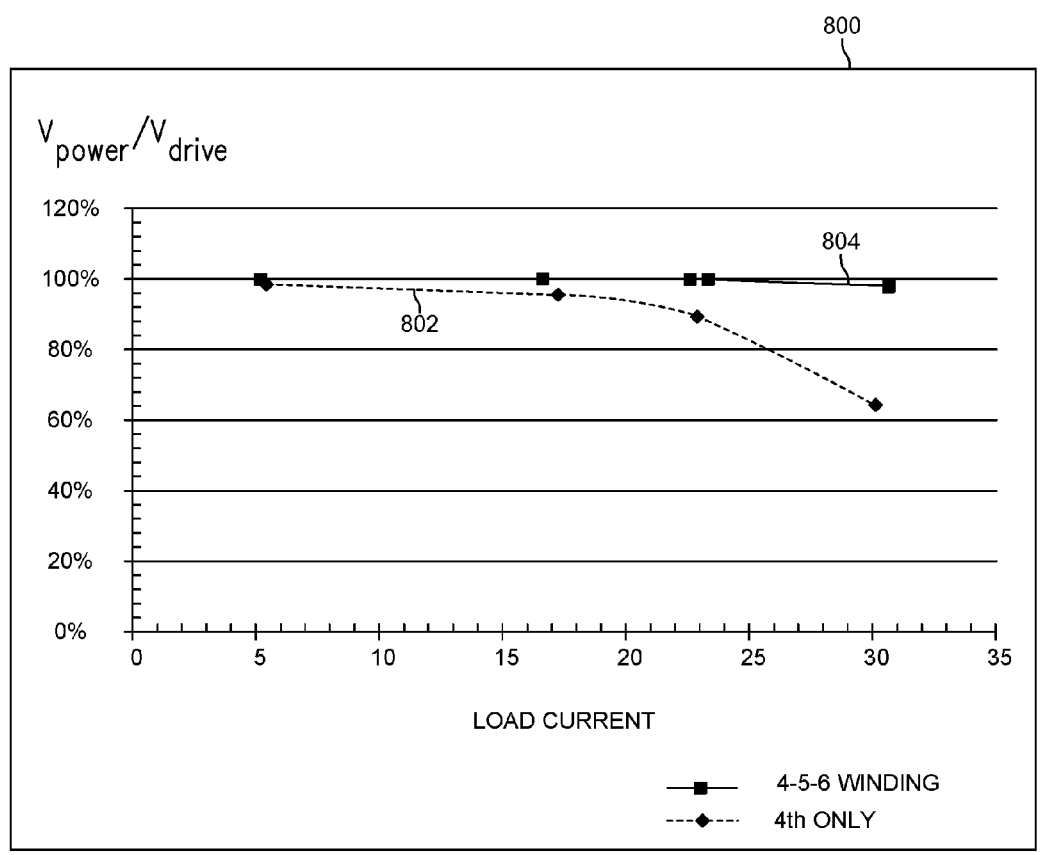
FIG. 8 is a chart illustrating the coupling performance of the enhanced motor drive system of FIG. 5.

Another advantage provided by the enhanced common-mode transformer 504 of the system 500 is improved coupling between power and drive throughout the rated load range. For example, as illustrated in the chart 700 of FIG. 7, the coupling improves to approximately 100% when the system is not under load. This advantage is further illustrated in chart 800 of FIG. 8, which illustrates the percentage of 5 kHz coupling of power to drive over load for both the system 400 and the enhanced system 500. As shown by the line 802, as load current increases in the conventional transformer 404 of the system 400, the coupling between the drive and power drops off from nearly 100% to nearly 60%. However, as shown by the line 804, using the enhanced common-mode transformer 504 of the system 500, the coupling between power and drive remains at nearly 100% throughout the rated range of 21 amperes and beyond.

Thus, the invention provides, among other things, an enhanced common mode inductor, an enhanced common-mode transformer, and an enhanced three-phase motor drive system.

What is claimed is:

1. A common mode inductor comprising:
  a core;
  a first winding pair wound on a first portion of the core, wherein the first winding pair includes a first choke winding and a first coupling winding that is electrically isolated from the first choke winding, and further wherein the first choke winding and the first coupling winding have an identical number of turns and are wound in the same direction;
  a second winding pair wound on a second portion of the core, wherein the second winding pair includes a second choke winding and a second coupling winding that is electrically isolated from the second choke winding, and further wherein the second choke winding and the second coupling winding have an identical number of turns and are wound in the same direction; and
  a third winding pair wound on a third portion of the core, wherein the third winding pair includes a third choke winding and a third coupling winding that is electrically isolated from the third choke winding, and further wherein the third choke winding and the third coupling winding have an identical number of turns and are wound in the same direction.

2. The inductor of claim 1, wherein
  the first choke winding and the first coupling winding are both wound around a first portion of the core;
  the second choke winding and the second coupling winding are both wound around a second portion of the core;
  the third choke winding and the third coupling winding are both wound around a third portion of the core; and
  the first portion, the second portion, and the third portion are distinct from one another.

3. The inductor of claim 1, wherein the first, second, and third coupling windings and the first, second, and third choke windings have an identical number of turns about the core.

4. The inductor of claim 1, wherein the first coupling winding, the second coupling winding, and the third coupling winding are electrically coupled to one another in parallel.

5. The inductor of claim 1, further comprising:
  an insulation barrier positioned between the first, second, and third coupling windings and the first, second, and third choke windings.

6. The inductor of claim 1, wherein the first choke winding, the second choke winding, and the third choke winding are wound from insulated conductors each having a first gauge.

7. The inductor of claim 6, wherein the first coupling winding, the second coupling winding, and the third coupling winding are wound from insulated conductors each having a second gauge,
  wherein the second gauge is lower than the first gauge.

8. The inductor of claim 1, wherein at least one of the group consisting of the first, second, and third coupling windings and the first, second, and third choke windings is wound from an insulated conductor that includes multiple strands of wire.

9. The inductor of claim 1, wherein the core one selected from the group consisting of a toroidal ferrite core, a toroidal steel core, and a toroidal powder core.

10. A drive system for a three-phase motor, the system comprising:
  a set of filter inductors;
  a capacitor neutral star connection coupled to the set of filter inductors;
  a common-mode transformer coupled to the three-phase motor;
  a variable speed drive coupled to the iron core transformer and the common mode transformer, the variable speed drive providing a three-phase power signal to drive the three-phase motor; and
  a DC bus having a DC bus midpoint;
  wherein the common-mode transformer includes
    a toroidal ferrite core,
    a first choke winding,
    a second choke winding,
    a third choke winding,
    a first coupling winding collocated with the first choke winding,
    a second coupling winding collocated with the second choke winding, and
    a third coupling winding collocated with the third choke winding,
  wherein the first, second, and third coupling windings are coupled in parallel to one another, and
  wherein the coupled windings couple a neutral point of the capacitor neutral star connection to the DC bus midpoint.

11. The drive system of claim 10, wherein
  the first coupling winding that is electrically isolated from the first choke winding and wound in the same sense as the first choke winding;
  the second coupling winding is electrically isolated from the second choke winding and wound in the same sense as the second choke winding; and
  the third coupling winding is electrically isolated from the third choke winding and wound in the same sense as the third choke winding.

12. The drive system of claim 10, wherein
  the first choke winding and the first coupling winding are both wound around a first portion of the toroidal ferrite core;
  the second choke winding and the second coupling winding are both wound around a second portion of the toroidal ferrite core;
  the third choke winding and the third coupling winding are both wound around a third portion of the toroidal ferrite core; and
  the first portion, the second portion, and the third portion are distinct from one another.

13. The drive system of claim 10, wherein the first, second, and third coupling windings and the first, second, and third choke windings have an identical number of turns about the toroidal ferrite core.

14. The drive system of claim 10, wherein the common-mode transformer further includes an insulation barrier positioned between the first, second, and third coupling windings and the first, second, and third choke windings.

15. The drive system of claim 10, wherein the first choke winding, the second choke winding, and the third choke winding are wound from insulated conductors each having a first gauge.

16. The drive system of claim 14, wherein the first coupling winding, the second coupling winding, and the third coupling winding are wound from insulated conductors each having a second gauge, wherein the second gauge is lower than the first gauge.

17. The drive system of claim 10, wherein at least one of the group consisting of the first, second, and third coupling windings and the first, second, and third choke windings is wound from an insulated conductor that includes multiple strands of wire.

18. A common mode transformer comprising:
a toroidal ferrite core;
a first choke winding;
a second choke winding;
a third choke winding;
a first coupling winding collocated with the first choke winding;
a second coupling winding collocated with the second choke winding; and
a third coupling winding collocated with the third choke winding, wherein the first, second, and third coupling windings are coupled in parallel to one another;

wherein the first coupling winding is electrically isolated from the first choke winding, and further wherein the first choke winding and the first coupling winding have an identical number of turns and are wound in the same direction;

wherein the second coupling winding is electrically isolated from the second choke winding, and the second choke winding and the second coupling winding have an identical number of turns and are wound in the same direction; and wherein the third coupling winding is electrically isolated from the third choke winding, and the third choke winding and the third coupling winding have an identical number of turns and are wound in the same direction.

19. The common mode transformer of claim 17, wherein the first choke winding and the first coupling winding are both wound around a first portion of the toroidal ferrite core;

the second choke winding and the second coupling winding are both wound around a second portion of the toroidal ferrite core;

the third choke winding and the third coupling winding are both wound around a third portion of the toroidal ferrite core; and the first portion, the second portion, and the third portion are distinct from one another.

* * * * *